US010516260B2

(12) United States Patent
Bemat et al.

(10) Patent No.: US 10,516,260 B2
(45) Date of Patent: Dec. 24, 2019

(54) MULTI-NODE SYSTEM FAULT MANAGEMENT

(71) Applicant: HEWLETT PACKARD ENTERPRISE DEVELOPMENT LP, Houston, TX (US)

(72) Inventors: Mohamed Amin Bemat, Houston, TX (US); Howard Leverenz, Houston, TX (US); Daniel Humphrey, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 229 days.

(21) Appl. No.: 15/446,458

(22) Filed: Mar. 1, 2017

(65) Prior Publication Data

US 2018/0254626 A1 Sep. 6, 2018

(51) Int. Cl.
| | | |
|---|---|---|
| *H02H 3/44* | (2006.01) |
| *G01R 31/02* | (2006.01) |
| *G01R 19/12* | (2006.01) |
| *H02H 3/04* | (2006.01) |
| *G01R 19/165* | (2006.01) |

(52) U.S. Cl.
CPC ............ *H02H 3/44* (2013.01); *G01R 19/12* (2013.01); *G01R 31/025* (2013.01); *H02H 3/04* (2013.01); *G01R 19/16576* (2013.01)

(58) Field of Classification Search
CPC .................................. H02H 3/20; H02H 9/04
USPC ........................................................ 361/86
See application file for complete search history.

(56) References Cited

U.S. PATENT DOCUMENTS

| | | | |
|---|---|---|---|
| 6,151,202 A | * | 11/2000 | Mueller .............. G06F 13/4081 361/111 |
| 6,489,748 B1 | | 12/2002 | Okamura |
| 6,614,133 B2 | | 9/2003 | Belson et al. |
| 6,661,119 B2 | | 12/2003 | Liu et al. |
| 7,656,631 B2 | | 2/2010 | Brattel |

(Continued)

FOREIGN PATENT DOCUMENTS

JP 2013223318 A 10/2013

OTHER PUBLICATIONS

Aksa Power Generation (China) Co.,Ltd, "Parallel Generators and Synchronization, Generator Power System Design," (Research Paper), 2012, 16 pages.

*Primary Examiner* — Dharti H Patel
(74) *Attorney, Agent, or Firm* — Hewlett Packard Enterprise Patent Department

(57) ABSTRACT

Examples disclosed herein relate to multi-node system fault management. In some of the examples disclosed herein, a fault detection circuit may distinguish between normal operating conditions of a multi-node system and faults that occur between the overcurrent protection of the system's power supplies and the hot plug protection of the system's nodes. The fault detection circuit may detect these faults by monitoring a voltage at the node's backplane connector prior to the input of the node's hot plug protection interface. If the magnitude of the monitored voltage drops below a threshold voltage at a rate that exceeds a threshold rate, the fault detection circuit may determine that a fault has occurred and may communicate the fault to the power supplies. The power supplies may receive the fault communication and shut off their power outputs to prevent the fault from causing damage to the components in the system.

13 Claims, 9 Drawing Sheets

(56) References Cited

U.S. PATENT DOCUMENTS

| | | | |
|---|---|---|---|
| 8,666,026 B1* | 3/2014 | Brethour | H04M 3/56 361/1 |
| 2012/0201059 A1* | 8/2012 | Berggren | H02H 7/268 363/53 |
| 2014/0277802 A1 | 9/2014 | Tomas et al. | |

* cited by examiner

MULTI-NODE SYSTEM FAULT MANAGEMENT

BACKGROUND

Multi-node systems may be equipped with various fault protection interfaces. These fault protection interfaces may prevent the nodes, and other equipment in the system, from being damaged as a result of various fault conditions.

BRIEF DESCRIPTION OF THE DRAWINGS

The following detailed description references the drawings, wherein.

DETAILED DESCRIPTION

Figure 1:
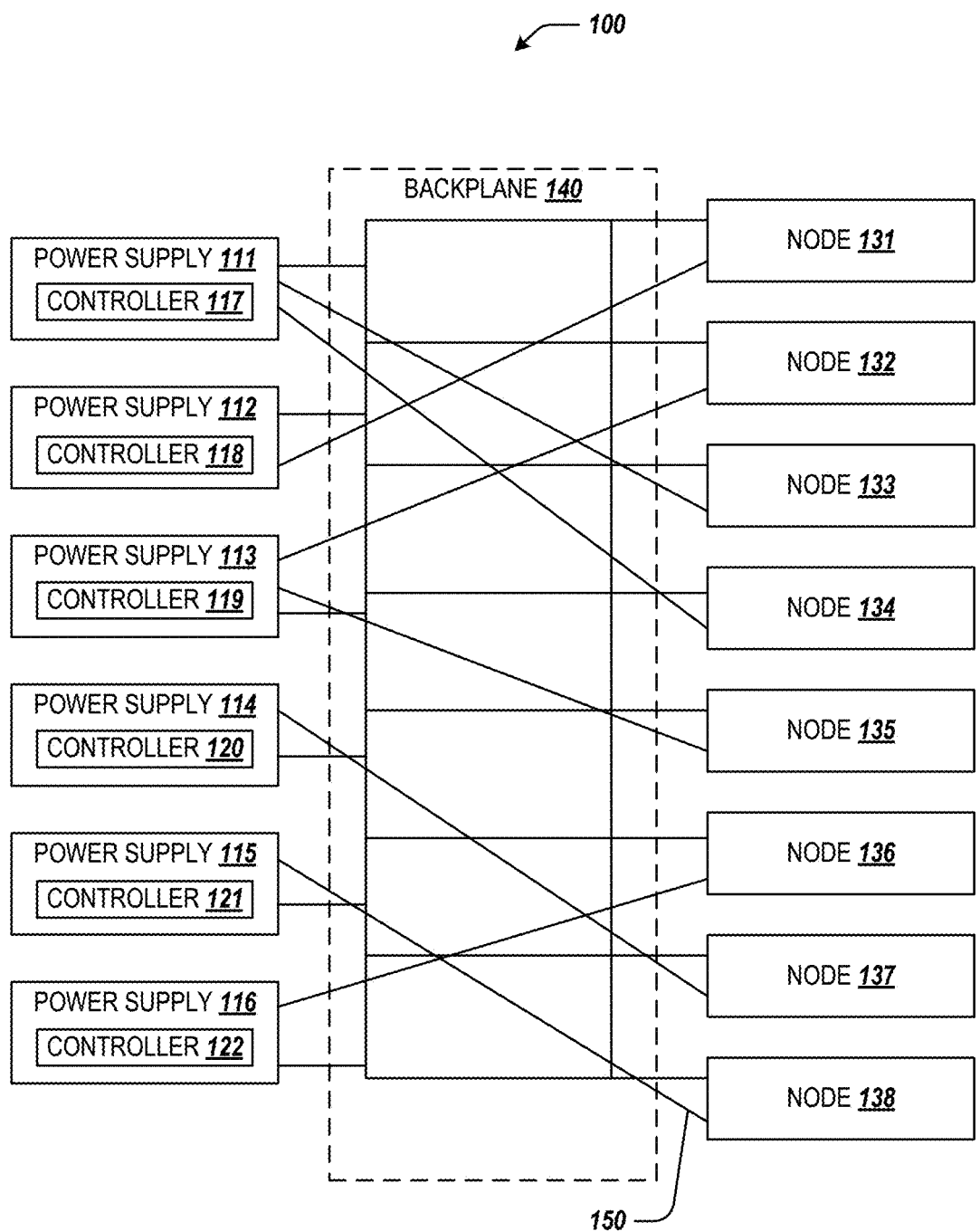
FIG. 1 is a block diagram of an example system for multi-node system fault management.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

A multi-node system may include a plurality of power supplies and nodes connected via a backplane. The power supplies may be equipped with various types of fault protection interfaces like overcurrent protection and over-temperature protection. An overcurrent interface monitors the current draw on the power supply and shuts off the power supply's output in response to detecting the current draw exceeding a predefined limit. Over-temperature protection works in a similar fashion by shutting off the power supply's output in response to the power supply's temperature exceeding a threshold. As a result of these protection interfaces, circuitry in the power supplies prior to these interfaces are protected from harm.

The nodes in the multi-node system may also be equipped with various types of fault protection interfaces that protect the circuitry internal to the nodes. For example, each node may have hot plug protection that allows the nodes to be swapped in and out of the system while the system is powered. The hot plug protection may prevent any capacitance on the node from causing an under-voltage condition in neighboring nodes when the node is plugged into the backplane.

While the above-described protections may detect faults that occur in the power supply before the overcurrent/over-temperature protections and faults that occur in the node after the hot plug protection, they may be unable to detect faults that occur after the power supply's protections and before the node's protection. For example, a short in a backplane printed circuit board (PCB) or backplane connector may cause a low impedance on the power supply input of the node that may go undetected by the power supply and node protection interfaces. This low impedance scenario can cause significant energy consumption, which may not be perceptible by the power supplies because it may not trip the overcurrent protection in the power supplies. From a current draw perspective, the current slew rate that occurs during these types of faults may not appear to be much more significant to the power supplies than what is seen when the nodes in the enclosure are under heavy use.

Examples disclosed herein provide technical solutions to these technical challenges by providing for fault condition mitigation in multi-node systems. In some examples disclosed herein, a fault detection circuit may distinguish between normal operating conditions of a multi-node system and faults that occur between the power supply's overcurrent protection and the node's hot plug protection. The fault detection circuit may detect these faults by monitoring the voltage on the node's backplane connector prior to the input of the node's hot plug protection interface. If the magnitude of the monitored voltage drops below a threshold voltage at a rate that exceeds a threshold rate, the fault detection circuit may determine that a fault has occurred and may communicate the fault to the power supplies in the blade enclosure system. The power supplies may receive the fault communication and shut off their power outputs to prevent the fault from causing damage to the components in the system.

FIG. 1 is a block diagram of a multi-node system 100 for multi-node system fault management. As shown in FIG. 1, system 100 may include various components, such as a plurality of power supplies 111-116 that provide power to a plurality of nodes 131-138 via a backplane 140. The number and arrangement of these components is an example only and provided for purposes of illustration. Other arrangements and numbers of components may be utilized without departing from the examples of the present disclosure. For example, system 100 may include more or fewer power supplies and/or nodes.

System 100 may be included in a physical enclosure such as a blade enclosure, rack chassis, server tower, or any other type of modular computing enclosure having a backplane connection system. For example, system 100 may be a blade system in a blade enclosure and nodes 131-138 may be blade servers, storage, switches, etc. The physical enclosure housing system 100 may perform various functions and provide various services to the components included in system, such as supplying cooling and system management.

Backplane 140 may be implemented as a set of interconnected sockets on a circuit card assembly into which power supplies 111-116, nodes 131-138, and other components included in system 100 may be inserted. Backplane 140 may provide the connections between power supplies 111-116, nodes 131-138, and other components included in system 100.

Nodes 131-138 may be connected to backplane 140 via a backplane connector(s). Nodes 131-138 may be a combination of electronic hardware/circuitry and software/firmware, and may implemented by various types of modular subsystems, such as blade or rack-mount servers, networking modules, storage modules, input/output (I/O) modules, etc. In some implementations, Nodes 131-138 may be hot pluggable in that they may be inserted into backplane 140 and removed while system 100 is powered and operating. In order to prevent damage to the nodes, nodes 131-138 may include some form of hot plug protection (not shown) that may prevent any capacitance on the node from causing an under-voltage condition in neighboring nodes when the node is plugged into backplane 140. The hot plug protection of each node may protect the circuitry internal to the node after the hot plug protection.

Power supplies 111-116 may provide power to nodes 131-138 and other components of system 100. Power supplies 111-116 may be connected in parallel and connected to nodes 131-138 in parallel such that they can communicate between each other and so they can provide some level of redundancy. For example, power supplies 111-116 may be operated such that the maximum power output of each power supply under normal operating conditions is around 50% capacity of the power supply. Thus, if a scenario occurs where half of power supplies 111-116 are taken offline (due to failures in those power supplies, for example), the other half will still have enough capacity to continue powering system 100 in the absence of those power supplies.

Power supplies 111-116 may be implemented by various types of rack-mountable power supplies, such as rack-mountable uninterruptable power supplies. In order to prevent damage to the power supplies, power supplies 111-116 may include various types of fault protection (not shown), such as overcurrent protection and over-temperature protection. The overcurrent protection may protect the components of power supplies 111-116 from being damaged due to significant current draw events that may exceed the current ratings of power supplies 111-116. The over-temperature protection may prevent the components of power supplies 111-116 from overheating due to high internal temperatures.

As shown in FIG. 1, power supplies 111-116 may each respectively include a power supply controller 117-122. Controllers 117-122 may monitor and control various operating aspects of power supplies 111-116. Controllers 117-122 may be implemented by a controller or microcontroller that includes a processor such as a central processing unit (CPU), a dedicated integrated circuit such as an ASIC (application-specific integrated circuit), or a dedicated FPGA (field-programmable gate array). The processor may be a single processor or a plurality of processors. The processor may be capable of executing instructions (e.g., stored on a machine-readable storage medium of controllers 117-122) that, when executed (e.g., by the processor of controllers 117-122), offer the functionality of controllers 117-122 described herein. In some examples, controllers 117-122 may be implemented as a combination of electronic circuitry (i.e., hardware) and software/firmware included in controllers 117-122 that implements the functionality of controllers 117-122.

As explained above, fault protection of power supplies 111-116 and the hot plug protection of nodes 131-138 may be unable to detect faults that occur in system 100 between these protections. For example, a fault such as a short circuit may occur in a backplane connector or backplane PCB on backplane 140 that may neither trip the overcurrent protection of power supplies 111-116 nor be protected against by the hot plug protection of nodes 131-138. In order to mitigate such faults, each of controllers 117-122 may include a fault detection circuit (not shown) connected to the backplane connector of at least one of nodes 131-138 by a sense line 150 via backplane 140. Sense lines 150 may allow the fault detection circuits of power supplies 111-116 to monitor an input voltage at the backplane connector of nodes 131-138 prior to the input of the hot plug protection.

A fault detection circuit in a power supply (e.g., one of power supplies 111-116) may monitor the input voltage at the backplane connector of a node (e.g., one of nodes 131-138) for drops in the input voltage. The fault detection circuit may be programmed to detect specific signatures of voltage drops. For example, the fault detection circuit may be programmed to declare faults for voltage drops below a threshold voltage where the voltage drops at a rate above a threshold rate. In some implementations, the magnitude and rate of the drop in voltage may be selected based on various criteria, such as the ratings of the power supplies, the ratings of the nodes, the expected loads in the system under various operating conditions, etc. In some implementations, the magnitude and rate of the drop in voltage may be selected by modelling the types of faults to be detected. An example threshold rate of the voltage drop may be 19,500 V/s and an example threshold magnitude may be 8.25V. If such a voltage drop is detected, the fault detection circuit may communicate a fault indication to the other power supplies in system 100 before shutting off its power output. The other power supplies in system 100 may receive the fault indication and shut off their power outputs in response.

Figure 2:
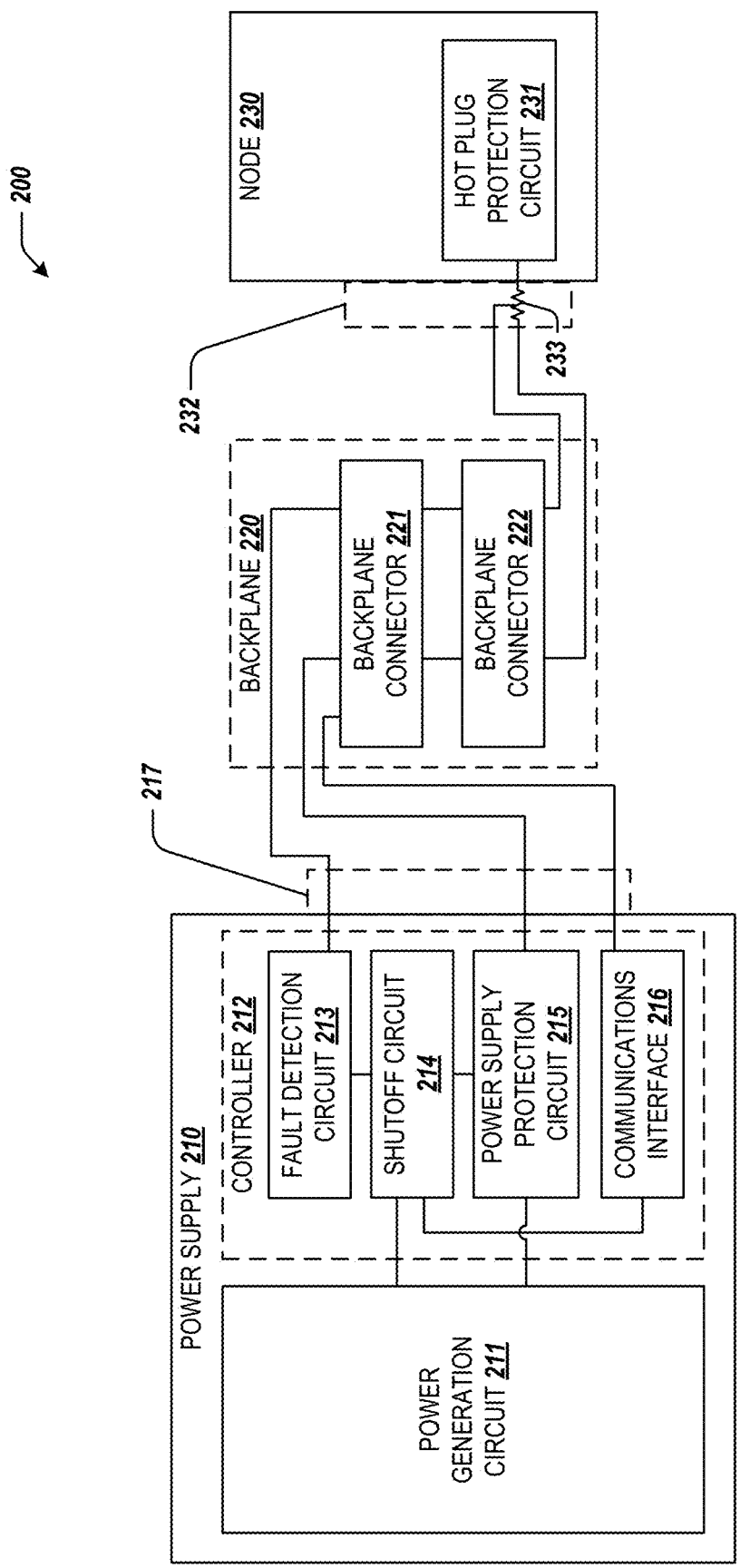
FIG. 2 is a block diagram of an example system for multi-node system fault management.

FIG. 2 is a block diagram of an example multi-node system 200 for multi-node system fault management. In some implementations, system 200 may be a subset of system 100 of FIG. 1. As shown in FIG. 2, system 200 may include various components, such as a power supply 210 and a node 230 connected via a backplane 220. Power supply 210 may be used to implement power supplies 111-116, controller 212 may be used to implement controllers 117-122, nodes 230 may be used to implement nodes 131-138, and backplane 220 may be used to implement backplane 140, all of FIG. 1. The number and arrangement of these components is an example only and provided for purposes of illustration. Other arrangements and numbers of components may be utilized without departing from the examples of the present disclosure.

As shown in FIG. 2, power supply 210 may be inserted into backplane connector 221 of backplane 220 via backplane connector 217. Similarly, node 230 may be inserted into backplane connector 222 via backplane connector 232. Backplane connector 221 may be connected to backplane connector 222 via, for example, electrical traces on backplane 220.

Power supply 210 may include a power generation circuit 211 and controller 212. Power generation circuit 211 may generate power and provide the power to, for example, node 230 via backplane 220. Controller 212, and fault detection circuit 213, shutoff circuit 214, power supply protection circuit 215, and communications interface 216 included therein, may be implemented as a combination of hardware and software/firmware similarly to controllers 117-122 of FIG. 1 as described above.

Controller 212 may perform various functions, such as tracking and adjusting the voltage output of power generation circuit 211. Power supply protection circuit 215 may include the overcurrent and over-temperature protection of power supply 210. If power supply protection circuit 215 detects an overcurrent or over-temperature situation, it may communicate instructions to shutoff circuit 214, which may shut off the output of power generation circuit 211.

Fault detection circuit 213 may monitor input voltages to hot plug protection circuit 231 at backplane connector 232 on a sense line via backplane 220. In some implementations, a significant and fast drop in voltage at backplane connector 232 may be an indication that a fault has occurred on backplane 220 (e.g., in backplane connector 221, backplane connector 222, in one of the PCBs of backplane 220) or even that a fault has occurred in hot plug protection circuit 231. Fault detection circuit 213 may detect voltage drops at backplane connector 232 based on the impedance 233 and the current draw at the input of hot plug protection circuit 231.

Fault detection circuit 213 may detect a voltage drop at backplane connector 232 and compare the rate of the voltage to a threshold rate and a magnitude of the voltage to a threshold voltage magnitude. If the voltage drops below the threshold voltage magnitude at a rate above the threshold rage, fault detection circuit 213 may communicate the fault and a shutoff command to other power supplies in system 200 via communications interface 216. The shutoff command may be a command to shut off the outputs of the other power supplies, and may be implemented using various types of signals such as a common open drain signal. Fault detection circuit 213 may communicate the shutoff command directly to the other power supplies in system 200 or indirectly through a blade enclosure manager or chassis manager. Communications interface 216 may be a variant of an inter-integrated circuit (I²C) bus, such as a system management bus (SMBus) or power management bus (PMBus).

After fault detection circuit 213 has communicated the shut off command to the other power supplies in system 200, fault detection circuit 213 may provide instructions to shut off circuit 214 to shut off the output of power generation circuit 211 to prevent the detected fault from causing damage to the various components in system 200. In some implementations, power supply 210 may receive a shut off command via communications interface 216 before fault detection circuit 213 detects a fault. In that case, communications interface 216 may provide the shutoff command to shut off circuit 214, which may shut off the output of power generation circuit 211.

Figure 3:
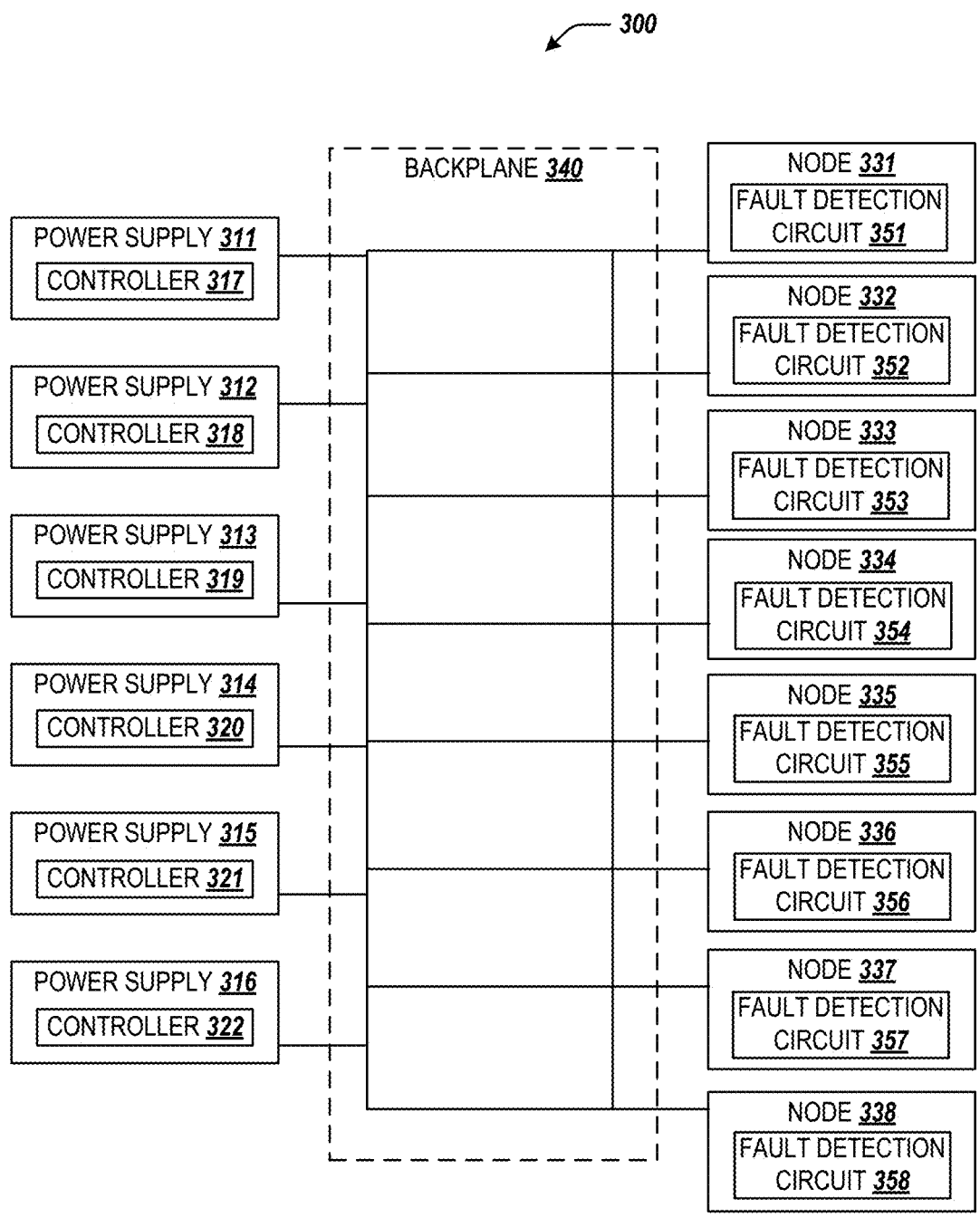
FIG. 3 is a block diagram of an example system for multi-node system fault management.

FIG. 3 is a block diagram of a system 300 for multi-node system fault management. As shown in FIG. 3, system 300 may include various components, such as a plurality of power supplies 311-316 that provide power to a plurality of nodes 331-338 via a backplane 340. The number and arrangement of these components is an example only and provided for purposes of illustration. Other arrangements and numbers of components may be utilized without departing from the examples of the present disclosure. For example, system 300 may include more or fewer power supplies and/or nodes. System 300 may be configured similarly to system 100 of FIG. 1 except that the fault detection circuits are included in the nodes instead of the power supplies. As such, remote sensing lines such as those illustrated in FIG. 1 are not needed, thus freeing up space on backplane 340.

As shown in FIG. 3, power supplies 311-316 may be connected in parallel to nodes 331-338. Each of nodes 331-338 may include a fault detection circuit (e.g., one of fault detection circuits 351-358) to monitor an input voltage at the backplane connector of its respective node to the input of the hot plug protection. Fault detection circuits 351-358 may be programmed to detect specific signatures of voltage drops. For example, fault detection circuits 351-358 may be programmed to declare faults for voltage drops below a threshold voltage where the voltage drops at a rate above a threshold rate. If such a voltage drop is detected, fault detection circuits 351-358 may communicate a fault indication to power supplies 311-316, which may include a command to shut off the power output of power supplies 311-316. In some implementations, the fault indication may include a command to shut off the power outputs of power supplies 311-316 after a time delay so that the power supplies do not cut power to nodes 331-338 before fault detection circuits 351-358 can communicate the fault indication to all of power supplies 311-316. An example time delay may be five milliseconds. Power supplies 311-316 may include a power supply controller (e.g., one of power supply controllers 317-322), which may receive the fault indication and, in response, may shut of the power output of its power supply.

Figure 4:
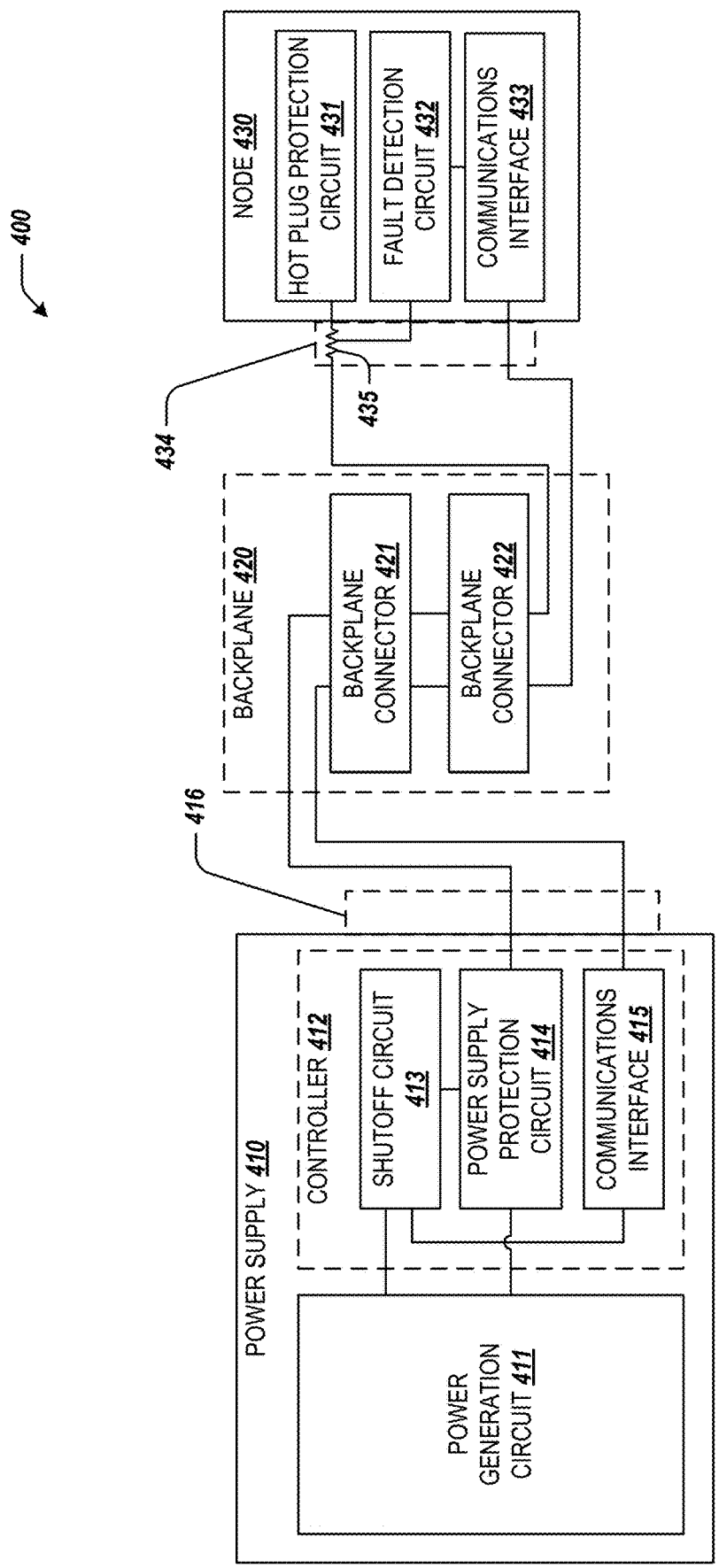
FIG. 4 is a block diagram of an example system for multi-node system fault management.

FIG. 4 is a block diagram of an example system 400 for multi-node system fault management. In some implementations, system 400 may be a subset of system 300 of FIG. 3. As shown in FIG. 4, system 400 may include various components, such as a power supply 410 and a node 430 connected via a backplane 420. Power supply 410 may be used to implement power supplies 311-316, controller 412 may be used to implement controllers 317-322, nodes 430 may be used to implement nodes 331-338, fault detection circuit 432 may be used to implement fault detection circuits 351-358, and backplane 420 may be used to implement backplane 340, all of FIG. 3. The number and arrangement of these components is an example only and provided for purposes of illustration. Other arrangements and numbers of components may be utilized without departing from the examples of the present disclosure.

As shown in FIG. 4, power supply 410 may be inserted into backplane connector 421 of backplane 420 via backplane connector 416. Similarly, node 430 may be inserted into backplane connector 422 via backplane connector 434. Backplane connector 421 may be connected to backplane connector 422 via, for example, electrical traces on backplane 420. Power supply 410 may include a power generation circuit 411 and controller 412. Node 430 may include a hot plug protection circuit 431, fault detection circuit 432, and a communications interface 433.

Fault detection circuit 432 may monitor input voltages to hot plug protection circuit 431 at backplane connector 434. In some implementations, a significant and fast drop in voltage at backplane connector 434 may be an indication that a fault has occurred on backplane 420 (e.g., in backplane connector 421, backplane connector 422, in one of the PCBs of backplane 420) or even that a fault has occurred in hot plug protection circuit 431. Fault detection circuit 432 may detect voltage drops at backplane connector 434 based on the impedance 435 and the current draw at the input of hot plug protection circuit 431.

Fault detection circuit 432 may detect a voltage drop at backplane connector 434 and compare the rate of the voltage to a threshold rate and a magnitude of the voltage to a threshold voltage magnitude. If the voltage drops below the threshold voltage magnitude at a rate above the threshold rage, fault detection circuit 432 may communicate the fault and a shutoff command to power supply 411 and other power supplies in system 400 via communications interface 433. The shutoff command may be a command to shut off the outputs of the power supplies. Fault detection circuit 432 may communicate the shutoff command directly to the power supplies in system 400 or indirectly through a blade enclosure manager or chassis manager. Communications interface 433 may be a variant of an inter-integrated circuit (I²C) bus, such as a system management bus (SMBus) or power management bus (PMBus).

Power supply 410, and the other power supplies in system 400 may receive the shutoff command at communications interface 414 and relay the shutoff command to shutoff circuit 413. Shutoff circuit 413 may shut off the power output of power generation circuit 411 to prevent the fault from damaging node 430 and other components in system 400.

Figure 5:
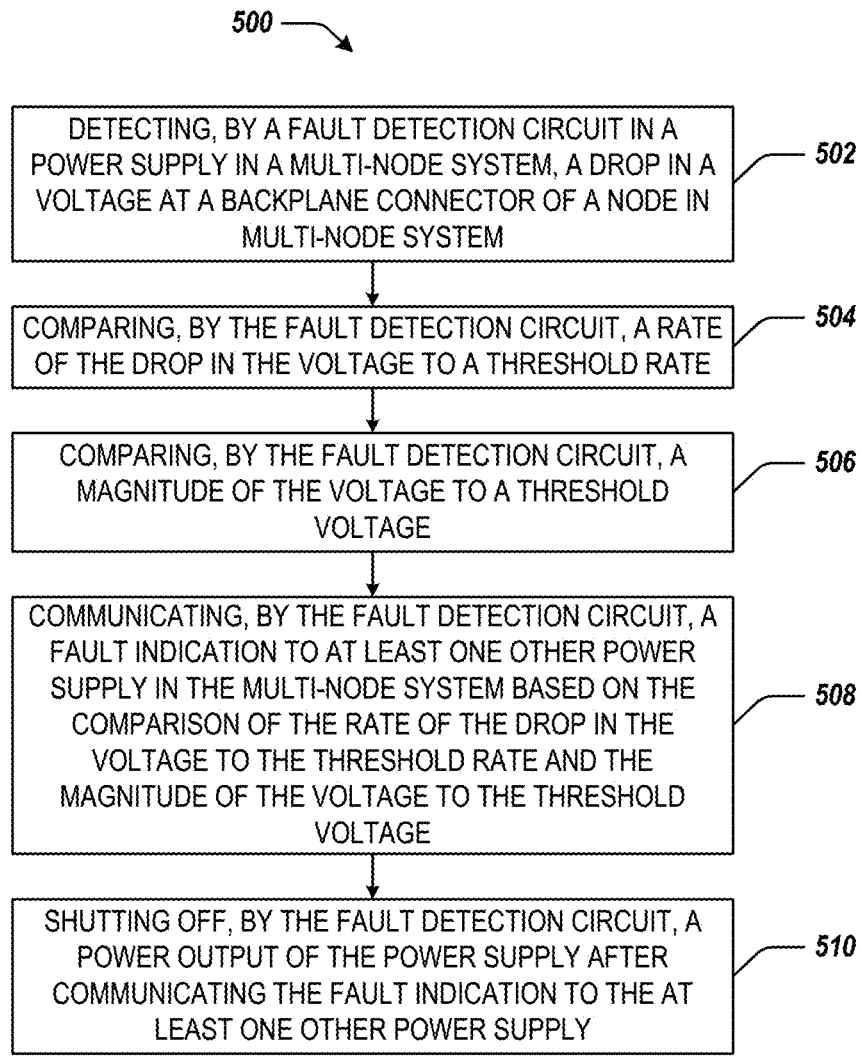
FIG. 5 is a flow diagram depicting an example method for mitigating fault conditions in a multi-node system.

FIG. 5 is a flowchart depicting an example method 500 for mitigating fault conditions in a multi-node. In some implementations, method 500 may be executed or performed, for example, by some or all of the system components described above in system 100 of FIG. 1 and/or system 200 of FIG. 2. As an example, the fault detection circuit of any one of power supplies 111-116 shown in FIG. 1 and/or fault detection circuit 213 of FIG. 2 may be responsible for implementing method 500. In some implementations, method 500 may be implemented in the form of executable instructions stored on at least one machine-readable storage medium of the system and executed by at least one processor of the system. Alternatively or in addition, method 500 may be implemented in the form of electronic circuitry (e.g., hardware). In some examples, steps of method 500 may be executed substantially concurrently or in a different order than shown in FIG. 5. In some examples, method 500 may include more or fewer steps than are shown in FIG. 5. In some examples, some of the steps of method 500 may, at certain times, be ongoing and/or may repeat.

At block 502, method 500 may include detecting, by a fault detection circuit in a power supply in a multi-node system, a drop in a voltage at a backplane connector of a node in the system. At block 504, method 500 may include comparing, by the fault detection circuit, a rate of the drop in the voltage to a threshold rate. At block 506, method 500 may include comparing, by the fault detection circuit, a magnitude of the voltage to a threshold voltage. At block 508, method 500 may include communicating, by the fault detection circuit, a fault indication to at least one other power supply in the system based on the comparison of the rate of the drop in the voltage to the threshold rate and the magnitude of the voltage to the threshold voltage. At block 510, method 500 may include shutting off, by the fault detection circuit, a power output of the power supply after communicating the fault indication to the at least one other power supply.

Figure 6:
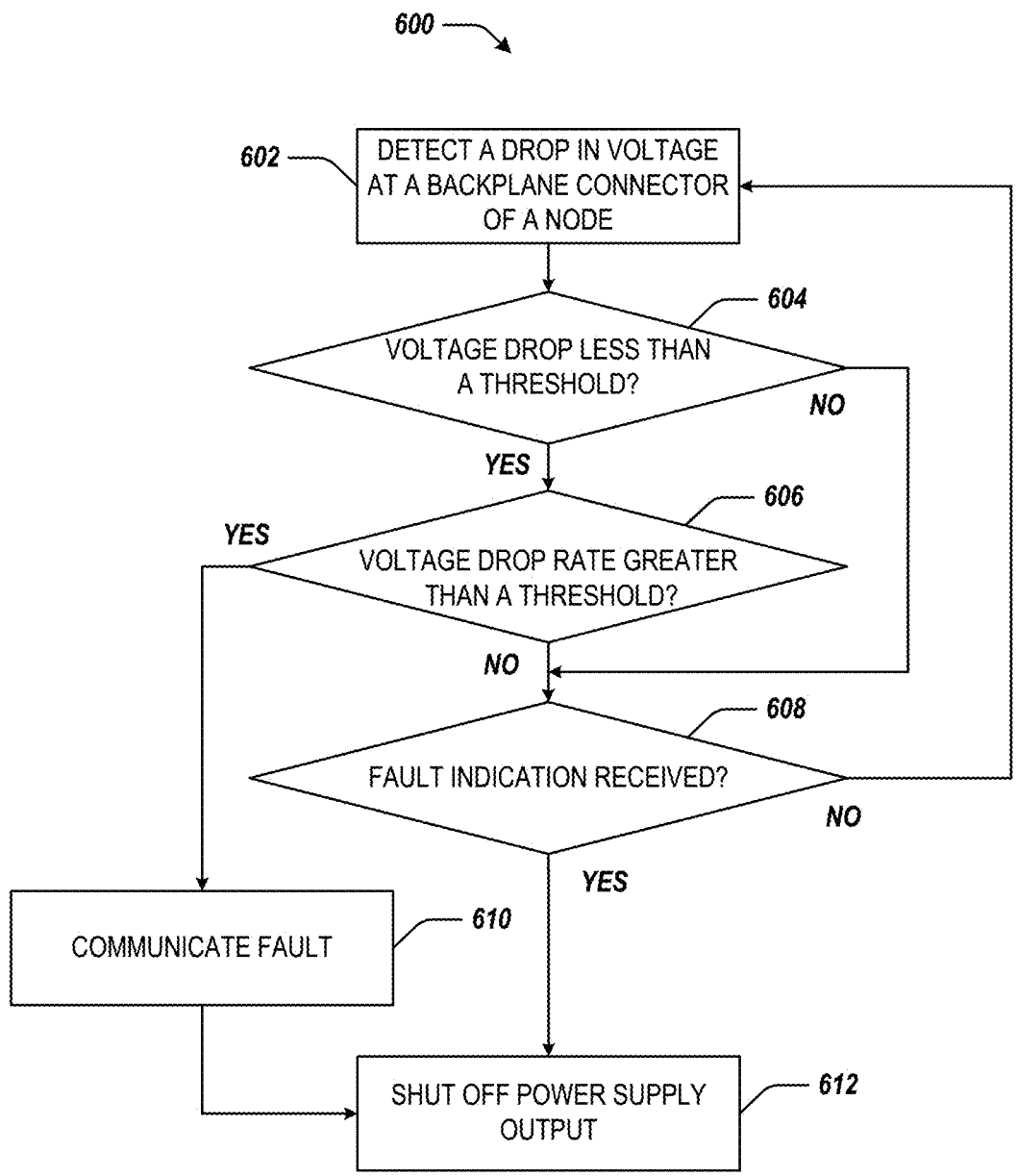
FIG. 6 is a flow diagram depicting an example method for mitigating fault conditions in a multi-node system.

FIG. 6 is a flowchart depicting an example method 600 for mitigating fault conditions in a multi-node system. In some implementations, method 600 may be executed or performed, for example, by some or all of the system components described above in system 100 of FIG. 1 and/or system 200 of FIG. 2. As an example, the fault detection circuit of any one of power supplies 111-116 shown in FIG. 1 and/or fault detection circuit 213 of FIG. 2 may be responsible for implementing method 600. In some implementations, method 600 may be implemented in the form of executable instructions stored on at least one machine-readable storage medium of the system and executed by at least one processor of the system. Alternatively or in addition, method 600 may be implemented in the form of electronic circuitry (e.g., hardware). In some examples, steps of method 600 may be executed substantially concurrently or in a different order than shown in FIG. 6. In some examples, method 600 may include more or fewer steps than are shown in FIG. 6. In some examples, some of the steps of method 600 may, at certain times, be ongoing and/or may repeat.

At block 602, method 600 may include detecting a drop in voltage at a backplane connector of a node in a multi-node system. At block 604, in response to detecting a voltage drop at 602, method 600 may include determining whether the magnitude of the voltage has dropped below a threshold voltage magnitude. At block 606, in response to determining that the voltage has dropped below the threshold voltage magnitude (604-YES), method 600 may include determining whether the rate of the voltage drop is greater than a threshold rate.

At block 610, in response to determining that the rate of the voltage drop is greater than a threshold rate (606-YES), method 600 may include communicating a fault indication including a shutdown command to other power supplies in the system. At block 612, after communicating the fault indication at 610, method 600 may include shutting down the output of the power supply.

If it is determined that the voltage has not dropped below the threshold voltage magnitude at (604-NO) or that the rate of the voltage is not greater than a threshold rate (606-NO), then at block 608, method 600 may include determining whether a fault indication including a shutdown command from another power supply in the system has been received.

At block 612, in response to determining that a fault indication from another power supply in the system has been received (608-YES), method 600 may include shutting down the output of the power supply. In response to determining that a fault indication from another power supply in the system has not been received (608-NO), method 600 may return to block 602 to continue monitoring the voltage on the backplane connector of the node.

Figure 7:
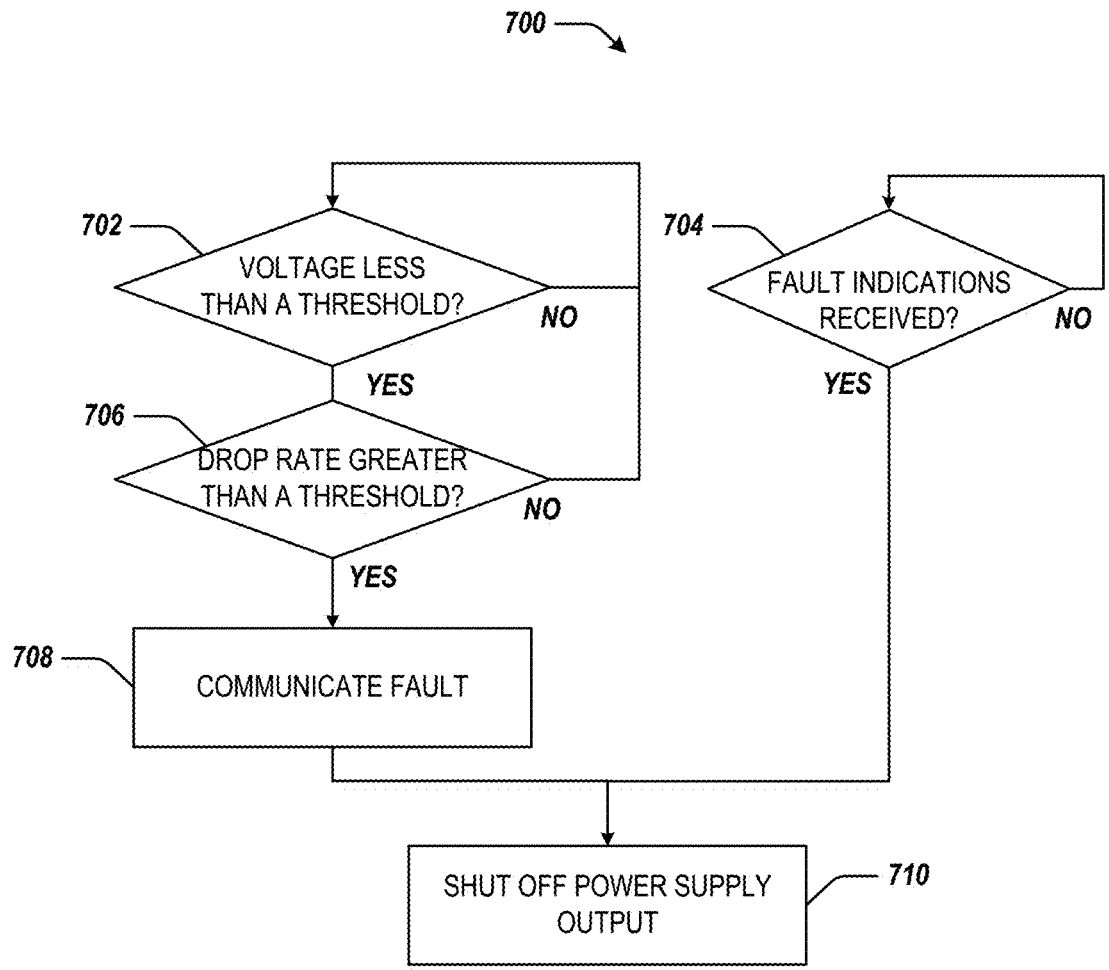
FIG. 7 is a flow diagram depicting an example method for mitigating fault conditions in a multi-node system.

FIG. 7 is a flowchart depicting an example method 700 for mitigating fault conditions in a multi-node system. In some implementations, method 700 may be executed or performed, for example, by some or all of the system components described above in system 100 of FIG. 1 and/or system 200 of FIG. 2. As an example, the fault detection circuit of any one of power supplies 111-116 shown in FIG. 1 and/or fault detection circuit 213 of FIG. 2 may be responsible for implementing method 700. In some implementations, method 700 may be implemented in the form of executable instructions stored on at least one machine-readable storage medium of the system and executed by at least one processor of the system. Alternatively or in addition, method 700 may be implemented in the form of electronic circuitry (e.g., hardware). In some examples, steps of method 700 may be executed substantially concurrently or in a different order than shown in FIG. 7. In some examples, method 700 may include more or fewer steps than are shown in FIG. 7. In some examples, some of the steps of method 700 may, at certain times, be ongoing and/or may repeat.

At blocks 702 and 704, method 700 may include determining a voltage at a backplane connector of a node in a multi-node system while simultaneously listening for fault indications on a communications bus. Before any fault indications are received at block 704 (704-NO), at block 702, method 700 may include determining whether a magnitude of the monitored voltage has dropped below a threshold voltage magnitude. If not (702-NO), the fault detection circuit may continue to monitor the voltage and listen for fault indications on the communications bus. If a fault indication is received prior to a voltage drop being detected at 702 (704-YES), at block 710, method 700 may include shutting down the output of the power supply in response to receiving the fault indication.

If it is determined that the magnitude of the monitored voltage has dropped below a threshold voltage magnitude (702-YES), at block 706, method 700 may include determining whether the rate of the voltage drop is greater than a threshold rate. If not (706-NO), the fault detection circuit may continue to monitor the voltage and listen for fault indications on the communications bus.

At block 708, in response to determining that the rate of the voltage drop is greater than a threshold rate (706-YES), method 700 may include communicating a fault indication including a shutdown command to other power supplies in the system. At block 710, after communicating the fault indication at 708, method 700 may include shutting down the output of the power supply.

Figure 8:
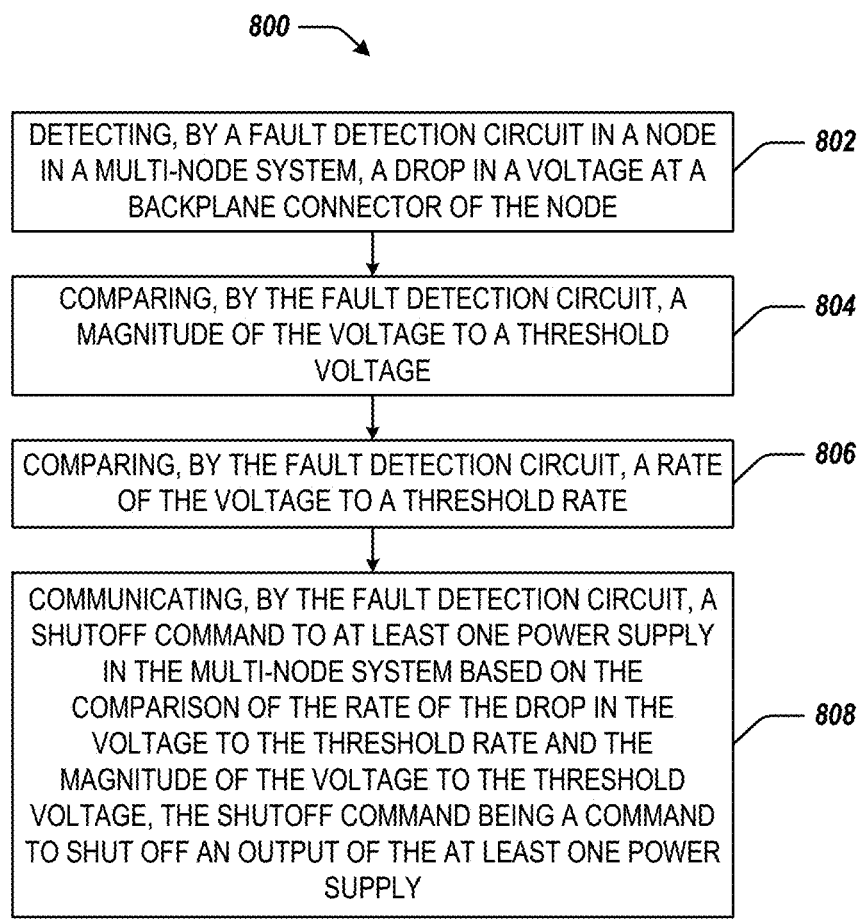
FIG. 8 is a flow diagram depicting an example method for mitigating fault conditions in a multi-node system.

FIG. 8 is a flowchart depicting an example method 800 for mitigating fault conditions in a multi-node system. In some implementations, method 800 may be executed or performed, for example, by some or all of the system components described above in system 300 of FIG. 3 and/or system 400 of FIG. 4. As an example, any one of the fault detection circuits 351-358 of nodes 331-338 shown in FIG. 3 and/or fault detection circuit 432 of FIG. 4 may be responsible for implementing method 800. In some implementations, method 800 may be implemented in the form of executable instructions stored on at least one machine-readable storage medium of the system and executed by at least one processor of the system. Alternatively or in addition, method 800 may be implemented in the form of electronic circuitry (e.g., hardware). In some examples, steps of method 800 may be executed substantially concurrently or in a different order than shown in FIG. 8. In some examples, method 800 may include more or fewer steps than are shown in FIG. 8. In some examples, some of the steps of method 800 may, at certain times, be ongoing and/or may repeat.

At block 802, method 800 may include detecting, by a fault detection circuit in a node in a multi-node system, a drop in a voltage at a backplane connector of the node in the system. The drop in the voltage may be detected prior to an input to a hot plug protection circuit of the node. In some implementations, detecting the drop in voltage may include detecting the drop in voltage based on an impedance at the backplane connector of the node.

At block 804, method 800 may include comparing, by the fault detection circuit, a magnitude of the voltage to a threshold voltage. At block 806, method 800 may include comparing, by the fault detection circuit, a rate of the drop in the voltage to a threshold rate.

At block 808, method 800 may include communicating, by the fault detection circuit, a shutoff command to at least one power supply in the system based on the comparison of the rate of the drop in the voltage to the threshold rate and the magnitude of the voltage to the threshold voltage, the shutoff command being a command to shut off an output of the at least one power supply. The shutoff command may be communicated to the at least one power supply in response to determining both that the magnitude of the voltage is less than the threshold voltage and that the rate of the drop in the voltage is greater than the threshold rate. In some implementations, the shutoff command may be a common open drain signal. The shutoff command may be communicated to the at least one power supply either directly or through a blade enclosure manager.

Figure 9:
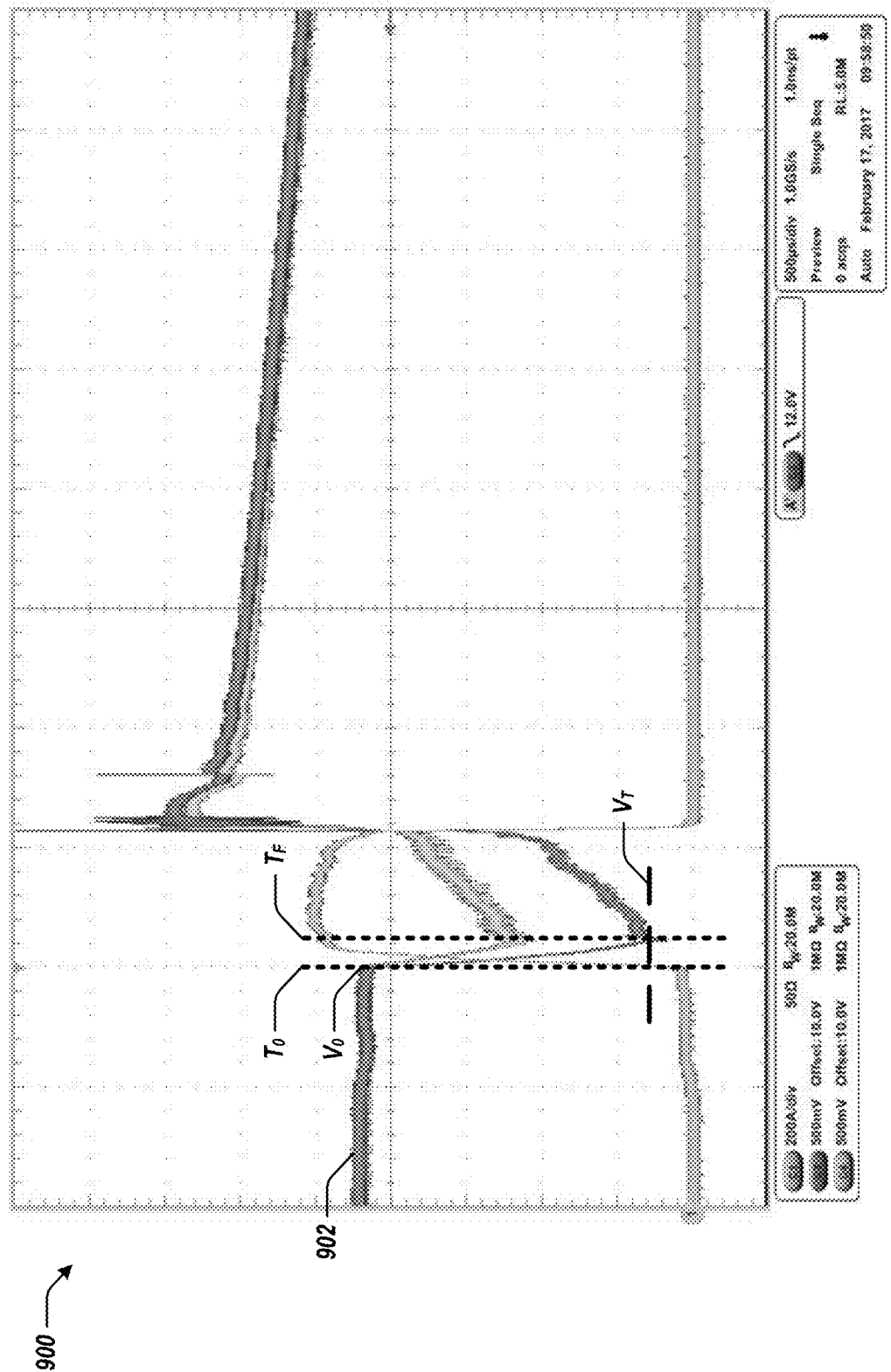
FIG. 9 is an illustration of an example waveform depicting an example fault condition in a multi-node system.

FIG. 9 is an illustration of an example waveform 900 depicting an example fault condition in a multi-node system. Example waveform 900 may be, for example, a waveform depicting an example of one type of fault condition detectable by the fault detection circuits in power supplies 111-116 of FIG. 1, fault detection circuit 213 of FIG. 2, the fault detection circuits 351-358 in nodes 331-338 of FIG. 3, and fault detection circuit 432 of FIG. 4.

In the example illustrated in FIG. 9, the x-axis of the waveform may be time and the y-axis of voltage 902 may be the magnitude of the voltage. At time $T_0$, voltage 902 may be at a voltage $V_0$. In the example shown in FIG. 9, $V_0$ may be around 10.2V. Starting at time $T_0$, a voltage drop in voltage 902 may commence and continue to time $T_F$, where voltage 902 drops below the voltage threshold $V_T$. In the example shown in FIG. 9, $V_T$ may be around 8.25V. At time $T_F$, if voltage 902 drops below threshold $V_T$ at greater than a threshold rate, any of the fault detection circuits disclosed herein may flag a fault. In the example illustrated in FIG. 9, the rate in the drop in voltage 902 between $V_0$ and $V_T$ is around 19,500 V/s.

The foregoing disclosure describes a number of example implementations for multi-node system fault management. The disclosed examples may include systems, devices, machine-readable storage media, and methods for multi-node system fault management. For purposes of explanation, certain examples are described with reference to the components illustrated in FIGS. 1-4. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples.

Further, the sequence of operations described in connection with FIGS. 5-8 are examples and is not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

The invention claimed is:

1. A method for mitigating fault conditions in a multi-node computing system, the method comprising:
   detecting, by a fault detection circuit in a node in the multi-node computing system, a fault based on detecting that a voltage at a backplane connector of the node has dropped below a threshold voltage; and communicating, by the fault detection circuit, a shutoff command to at least one power supply in the multi-node system responsive to detecting the fault, the shutoff command being a command to shut off an output of the at least one power supply.

2. The method of claim 1, comprising:

sensing the voltage at the backplane connector of the node based on an impedance at the backplane connector of the node.

3. The method of claim 1, comprising:

sensing the voltage at the backplane connector of the node at a location prior to an input to a hot plug protection circuit of the node.

4. The method of claim 1, wherein the shutoff command is a common open drain signal.

5. The method of claim 1, wherein the multi-node computing system is a blade computing system that includes a blade enclosure system manager and communicating the shutoff command to the at least one power supply in the multi-node system comprises communicating the shutoff command to the at least one power supply through the blade enclosure system manager.

6. The method of claim 1, wherein the detection of the fault is further based on detecting that the voltage at the backplane connector of the node has dropped at a rate exceeding a threshold rate.

7. A node, comprising:

a backplane connector to connect to a backplane of a multi-node computing system;

a fault detection circuit to:

sense a voltage at the backplane connector at a location after overcurrent protection circuitry of power supplies of the multi-node computing system and prior to a hot plug protection circuit of the node;

detect a fault based on detecting that the voltage at the backplane connector has dropped below a threshold voltage; and a communications interface to communicate, via a backplane of the multi-node computing system, a shutoff command to power supplies in the multi-node computing system in response to the fault detection circuit detecting the fault.

8. The node of claim 7, wherein the fault detection circuit is to:

sense the voltage at the backplane connector of the node based on an impedance at the backplane connector of the node on an input of the hot plug protection circuit of the node.

9. The node of claim 7, wherein the shutoff command is a command to shut off supply outputs of the power supplies after a time delay.

10. The node of claim 7, wherein the detection of the fault is further based on detecting that the voltage at the backplane connector of the node has dropped at a rate exceeding a threshold rate.

11. A method for mitigating fault conditions in a multi-node computing system, the method comprising:

detecting, by a fault detection circuit in a power supply in the multi-node computing system, a fault based on detecting that a voltage at a backplane connector of a node in the multi-node computing system has dropped below a threshold voltage;

communicating, by the fault detection circuit, a fault indication to at least one other power supply in the multi-node computing system responsive to detecting the fault; and shutting off a power output of the power supply responsive to detecting the fault and after communicating the fault indication to the at least one other power supply.

12. The method of claim 11, comprising:

receiving, at the at least one other power supply, the fault indication from the power supply; and in response to receiving the fault indication, shutting off the power output of the at least one other power supply.

13. The method of claim 11, wherein the detection of the fault is further based on detecting that the voltage at the backplane connector of the node has dropped at a rate exceeding a threshold rate.

* * * * *